(12) United States Patent
Ihren

(10) Patent No.: US 11,762,300 B2
(45) Date of Patent: Sep. 19, 2023

(54) METHOD AND DEVICE FOR PROCESSING PRINT DATA AND FOR PRINTING ACCORDING TO SUCH PRINT DATA

(71) Applicant: Mycronic AB, Taby (SE)

(72) Inventor: Fredric Ihren, Taby (SE)

(73) Assignee: Mycronic AB, Taby (SE)

( * ) Notice: Subject to any disclaimer, the term of this patent is extended or adjusted under 35 U.S.C. 154(b) by 22 days.

(21) Appl. No.: 17/437,273

(22) PCT Filed: Mar. 6, 2020

(86) PCT No.: PCT/EP2020/056083
§ 371 (c)(1),
(2) Date: Sep. 8, 2021

(87) PCT Pub. No.: WO2020/182680
PCT Pub. Date: Sep. 17, 2020

(65) Prior Publication Data
US 2022/0171289 A1 Jun. 2, 2022

(30) Foreign Application Priority Data
Mar. 11, 2019 (SE) .................................. 1950302-8

(51) Int. Cl.
*G03F 7/20* (2006.01)
*G03F 7/00* (2006.01)

(52) U.S. Cl.
CPC ............ *G03F 7/704* (2013.01); *G03F 7/2053* (2013.01); *G03F 7/70508* (2013.01)

(58) Field of Classification Search
CPC .... G03F 7/704; G03F 7/2053; G03F 7/70508; G03F 7/70383
See application file for complete search history.

(56) References Cited

U.S. PATENT DOCUMENTS

| 4,541,712 A | 9/1985 | Whitney |
| 4,620,288 A | 10/1986 | Weimers |
| 2018/0321595 A1 | 11/2018 | Ruecker et al. |

OTHER PUBLICATIONS

International Search Report PCT/ISA/210 for International Application No. PCT/EP2020/056083 dated Mar. 6, 2020.

*Primary Examiner* — Mesfin T Asfaw
(74) *Attorney, Agent, or Firm* — Harness, Dickey & Pierce, P.L.C.

(57) ABSTRACT

A method for processing print data defining a pattern to be printed comprises obtaining (S10) of vector print data for the pattern to be printed. The vector print data is divided (S12) into vector print data of scan strips, wherein each scan strip is associated with a scan velocity. A skew transformation of the vector print data is performed (S14) in each scan strip. The skew transformation is performed in a direction opposite to respective scan velocity and with a magnitude proportional to a magnitude of the scan velocity. A method for printing a pattern, a device for processing print data and a printing device according to the same principles are also disclosed.

20 Claims, 9 Drawing Sheets

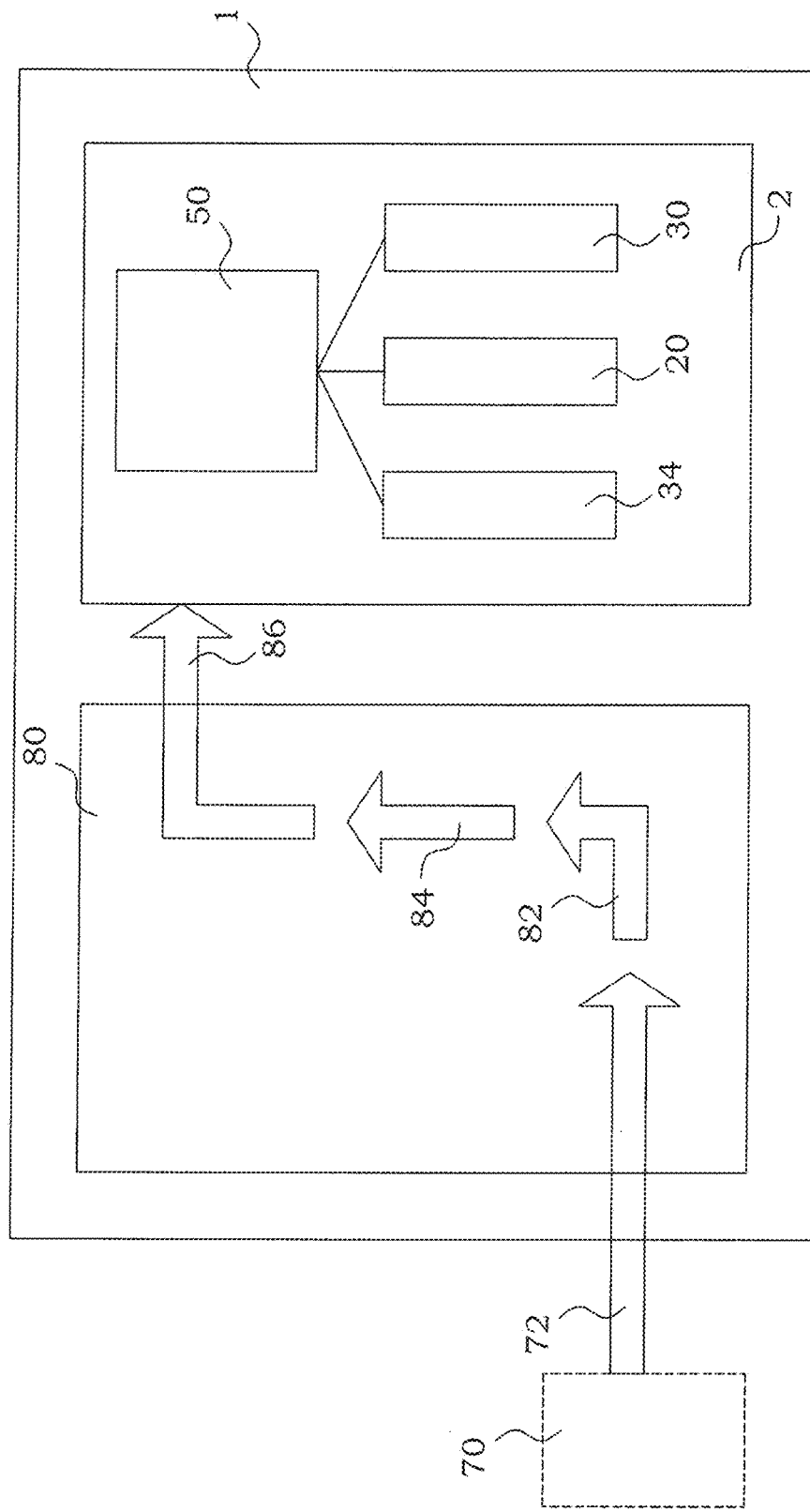

METHOD AND DEVICE FOR PROCESSING PRINT DATA AND FOR PRINTING ACCORDING TO SUCH PRINT DATA

CROSS-REFERENCE TO RELATED APPLICATIONS

This application is a national phase under 35 U.S.C. § 371 of PCT International Application No. PCT/EP2020/056083 which has an International filing date of Mar. 6, 2020, which claims priority to SE Application No. 1950302-8, filed Mar. 11, 2019, the entire contents of each of which are hereby incorporated by reference.

TECHNICAL FIELD

The technology presented here refers in general to methods and devices for printing, and in particular to methods and devices for pattern generation such as mask writers or direct writers.

BACKGROUND

In the semiconductor industry today, masks produced by laser-based mask writers are common for use for manufacturing of different kinds of advanced chips and image devices. Direct writers for e.g. electronic packaging are also standard today. During the last years, the production of larger and more accurate displays has also increased tremendously. Demands are therefore put e.g. on micro-lithographic printing processes to be faster, more accurate and less expensive.

In the field of micro-lithographic printing processes mask writers or direct writers may be based on a writing head providing one or several precision laser beams. The writing head and a substrate to which the writing is intended to be performed are movable relative to each other, either by moving the writing head or the substrate or both. By varying the power of the laser beam coordinated with the relative motion, an exposure pattern can be written onto the substrate.

A common method is to divide the total pattern into scan strips, in which the laser beams expose the surface of the substrate while the position of the writing head relative to the substrate scans from one side of the substrate to the other. The position of the writing head relative to the substrate is returned to the position before the scan and the position of the writing head relative to the substrate is stepped in a direction perpendicular to the scan in order to select a new scan strip to expose.

In order to further increase the printing speed, some printing devices apply a sweep action perpendicular to the scan direction during the scan. This results in that the laser beam can cover a larger width of the scan strip for each scan. The sweep of the laser beam may for instance be performed by acusto-optic deflectors, having a limited sweep width, but a very low reset time.

A further approach to increase the printing speed is to provide the writing head with more than one laser beam, which opens up for a simultaneous parallel writing of a number of laser beams, individually controlled.

One remaining drawback of such approaches is the time for the writing head to reset after a scan, since this involves mechanical movements over relatively large distances. The time for such a scan reset reduces the time available for printing.

SUMMARY

A general object of the present technology is to perform more time efficient printing.

The above object is achieved by methods and devices according to the independent claims. Preferred embodiments are defined in dependent claims.

In general words, in a first aspect, a method for processing print data defining a pattern to be printed comprises obtaining vector print data for the pattern to be printed. The vector print data is divided into scan strips, wherein each scan strip is associated with a scan velocity. A skew transformation of vector print data is performed in each scan strip. The skew transformation is performed in a direction opposite to the respective scan velocity and with a magnitude proportional to a magnitude of the scan velocity.

In a second aspect, a method for printing a pattern comprises processing of print data according to the first aspect. A printing process is controlled based on at least one of the vector print data and bit map print data, being based on the vector print data.

In a third aspect, a device for processing print data defining a pattern to be printed comprises processing circuitry and a memory. The memory comprises instructions executable by the processing circuitry, whereby the processing circuitry is operative to obtain vector print data for the pattern to be printed, to divide the vector print data into vector print data scan strips, wherein each scan strip is associated with a scan velocity, and to perform a skew transformation of the vector print data in each scan strip. The skew transformation is performed in a direction opposite to respective scan velocity and with a magnitude proportional to a magnitude of the scan velocity.

In a fourth aspect, a printing device comprises a device for processing of print data according to the third aspect, a printing head and a control unit. The printing head is movable relative to a substrate. The control unit is arranged to control an operation and relative motion of the printing head based on the skew transformed vector print data.

In a fifth aspect, a computer program comprises instructions, which when executed by a processing circuitry, cause the processing circuitry to obtain vector print data for a pattern to be printed, to divide the vector print data into vector print data scan strips, wherein each scan strip is associated with a scan velocity, and to perform a skew transformation of the vector print data in each scan strip. The skew transformation is performed in a direction opposite to respective scan velocity and with a magnitude depending on a magnitude of the scan velocity.

One advantage with the proposed technology is that it increases the system overall throughput. Other advantages will be appreciated when reading the detailed description.

BRIEF DESCRIPTION OF THE DRAWINGS

The invention, together with further objects and advantages thereof, may best be understood by making reference to the following description taken together with the accompanying drawings, in which:

FIG. 5 illustrates an example of a data path of scan data;

DETAILED DESCRIPTION

Throughout the drawings, the same reference numbers are used for similar or corresponding elements.

For a better understanding of the proposed technology, it may be useful to begin with a brief overview of some aspects of prior art printing devices and printing methods.

Figure 1:
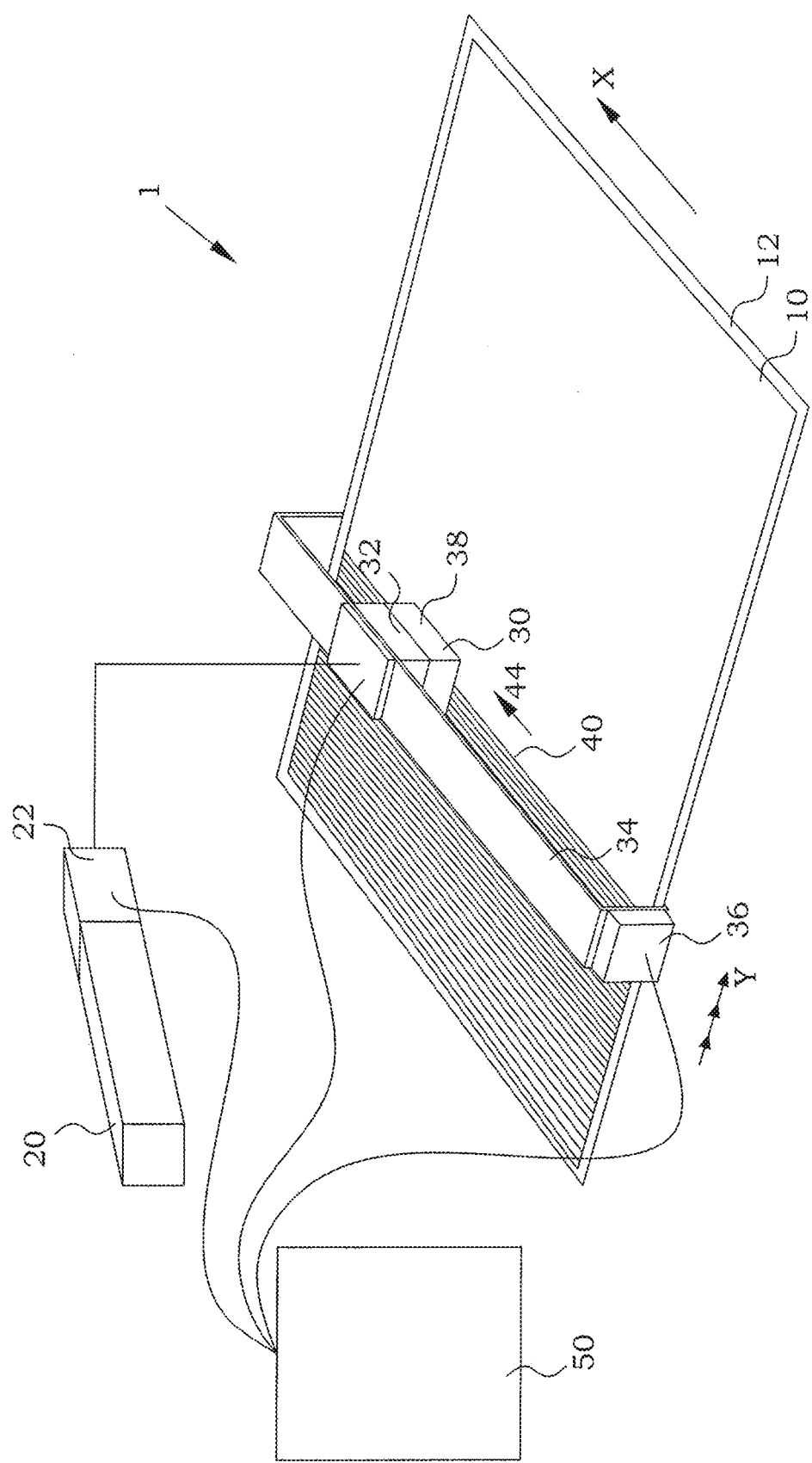
FIG. 1 illustrates an example of a printing device.

FIG. 1 illustrates one example of a printing device 1, typically used for a micro-lithographic printing process. A substrate support 12 carries a substrate 10, which is intended to be patterned by exposure of laser light. A laser unit 20 provides the laser light to a printing head 30. In this example, the laser unit is provided with a laser modulator 22, which modulates the power of the laser light according to print data defining a pattern to be printing, provided by a control unit 50. The laser modulation may e.g. be provided by using acousto-optic modulators.

In this example, the printing head 30 is movable over the width of the substrate 10 in the direction denoted by X, supported by a bridge 34. The motion is created in a scan direction 44 by a scan motion unit 32, in this example provided in or attached to the printing head 30. The scan motion is also controlled by the control unit 50, to be synchronized with e.g. the laser power modulation. A scan is defined as the relative mechanical motion between the printing head 30 and the scan area 10. During a scan, i.e. the motion of the printing head 30 over the width of the substrate 10 in the X direction, a certain part area of the substrate 10 is exposed to laser light. This part area is referred to as a scan strip 40. The exposure of the scan strip will be discussed further below.

In alternative examples, the scan can be created by instead moving the substrate 10, keeping the printing head 30 stationary, or moving both the substrate 10 and the printing head 30 in a coordinated manner.

After a scan is completed, the printing head 30 returns to the original position and, in this example, the bridge is stepped a distance in a direction perpendicular to the scan direction, by means of a scan strip stepping unit 36. This step in the direction denoted by Y may be equal to the scan strip width, so that the exposed area of the coming scan strip 40 connects to the previous scan strip 40. In such a way, the entire substrate 10 can be exposed to the laser light.

In other embodiments, the stepping in the Y direction may also be different from the scan strip width, typically smaller than the scan strip width. In such an embodiment, each spot at the substrate 10 will be exposed to the laser light a plurality of times. This can e.g. be useful for even out minor systematic errors in the printing process.

The control of the scan strip stepping unit 36 is synchronized with the control of the scan motion unit 32.

Also here, in alternative examples, the scan strip stepping can be obtained also by moving the substrate 10, keeping the bridge 34 stationary, or moving both the substrate 10 and the bridge in a coordinated manner.

In order to obtain scan strips 40 of widths that are wider than the diameter of the laser beam, typically an approach of utilizing microsweeps is applied. This is in the present example achieved by a laser deflector 38 connected to the printing head 30.

Figure 2:
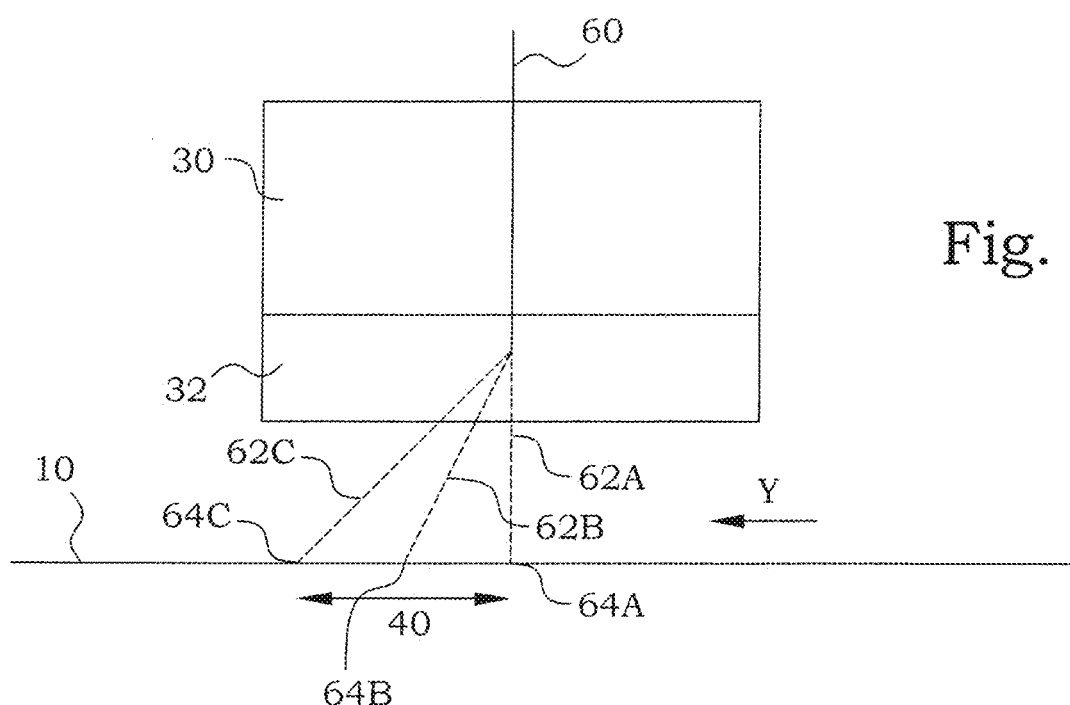
FIG. 2 schematically illustrates the operation of a laser deflector.

A schematic illustration of the operation of such a laser deflector 38 is shown in FIG. 2. A laser beam 60 is provided to the printing head 30. If the influence of the laser deflector 38 is shut off, the laser beam continues in a straight direction according to line 62A and hits the substrate 10 at a point 64A. If the laser deflector 38 is turned on, the laser beam can be deflected e.g. along a line 62B, hitting the substrate 10 at a point 64B. Alternatively, the laser deflector 38 deflects the laser beam e.g. along a line 62C, hitting the substrate 10 at a point 64C. In such a way, the laser deflector 38 can determine the point at which the laser beam 60 exposes the substrate 10 within the entire width of the scan strip 40. The laser deflector 38 may e.g. be realized by using acousto-optic deflection. This deflection possibility is often used during a scan, such that the laser beam is swept in a so-called microsweep across the width of the scan strip a number of times during the scan, i.e. simultaneously to the scan motion. The reset time for the laser deflector 38 is typically very short and the time between the end of one microsweep and the beginning of the following one is negligible in this context.

Figure 3:
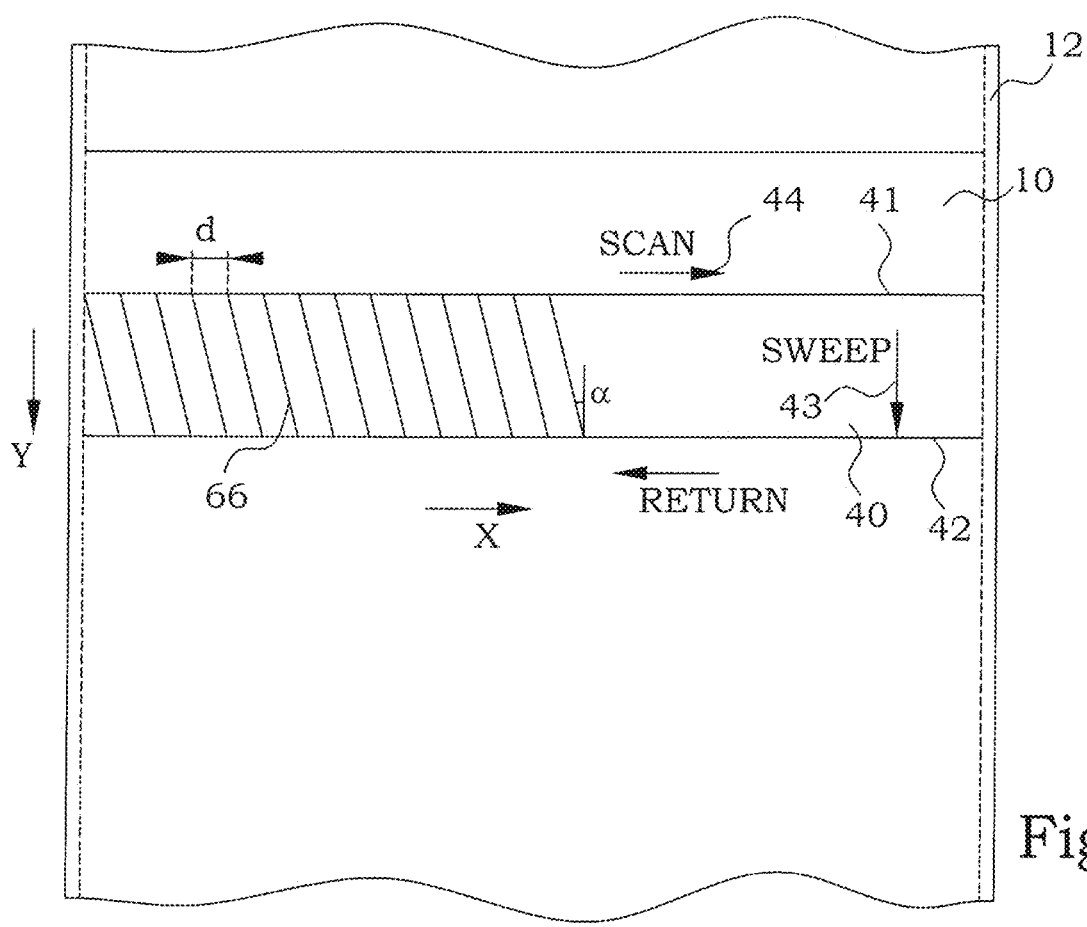
FIG. 3 schematically the origin of an azimuthal angle.

The simultaneous scan and sweep, however, gives rise to additional considerations. FIG. 3 illustrates one situation of a substrate 10 where simultaneous scan and sweep is used. When the scan begins, the printing head is situated at the left hand side of the substrate 10 and the laser beam hits the substrate 10 at one edge of the scan strip 40. During the time of a microsweep in a sweep direction 43 from a first border 41 of the scan strip 40 to a second border 42 of the scan strip 40, the laser beam is swept over to the opposite side, in the Y direction, of the scan strip, but at the same time the scan motion has moved the printing head a distance d in the scan direction 44. This means that the laser beam will follow a line 66 that is somewhat inclined compared to the Y-direction. In other words, the printing head is moving at constant speed while the microsweeps are made, which causes the microsweep exposure to be made at an angle $\alpha$, called the azimuth angle. The result will thus be a distortion of the printing pattern with this azimuth angle within each scan strip, if no further measures are taken.

Figure 4A:
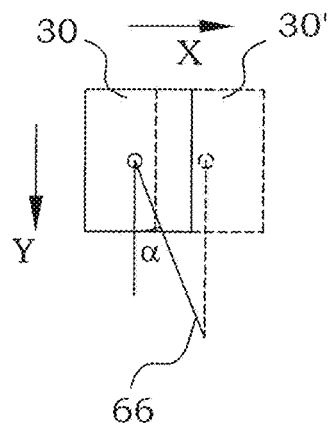
FIG. 4A schematically illustrates the motion of a printing head without azimuthal angle adjustment.
Figure 4B:
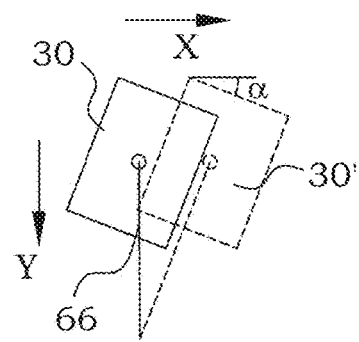
FIG. 4B schematically illustrates the motion of a printing head with azimuthal angle adjustment.

One standard way to compensate for such distortions is to mechanically adjust the azimuth angle of the printing head 30 so that the microsweep light deflection takes place at an opposite angle to the angle generated by the motion. The exposure can thus be calibrated to be perpendicular to the optical head movement direction. This is schematically illustrated in FIGS. 4A and 4B. In FIG. 4A, the non-adjusted printing head 30 is illustrated as seen in a direction perpendicular to the substrate. The full lines indicate the position of the printing head 30 at the start of a microsweep and the dotted lines 30' indicates the position at the end of a microsweep. The path of the laser beam then follows the line 66.

In FIG. 4B, the printing head 30, or at least the aligning of the microsweep is arranged at an angle $\alpha$, corresponding to the azimuth angle. The full lines indicates the position of the printing head 30 at the start of a microsweep and the dotted lines indicates the position at the end of a microsweep. One can here see that the line 66 now becomes perpendicular to the scan direction and there will be no distortions of the printed pattern.

Note that the azimuth angles illustrated in FIGS. 3, 4A and 4B are highly exaggerated, for illustrational purposes. Typical azimuth angles can be from a few tenth of a degree to a few degrees.

Finally, for completeness, it may be mentioned that many printing devices of today use printing heads with more than one laser beam in parallel. The beams are then typically provided side by side in the scan direction and operate simultaneously and typically with synchronized sweeps. The scan velocity and the distances between the different beams are adapted so that when all beams have passed a certain region at the substrate, all parts of that region have been exposed to laser light from one of the beams. However, the principles of azimuth angle and correction for this are the same as was discussed further above.

A schematic illustration of the data path of the scan data defining the pattern to be printed is shown in FIG. 5. Data representing a pattern is created in some kind of processing unit, here denoted as a design computer 70. This design computer 70 can be a part of the printing system or can be an externally provided computer. The output from the design computer 70 is typically design data 72 representing or defining the pattern to be printed. Also, typically, this design data 72 is provided in a vector representation, i.e. the pattern to be printed is described by defining objects, and their position and size. The design data 72 is received in the printing device 1 by a device for processing print data 80. In an alternative example, the device for processing print data 80 can also be provided as an external unit.

The device for processing print data 80 receives the vector design data 72. Typically, there is a transformation of the vector design data 72 from the design computer into internal-format vector print data 82 of the system. This makes it possible to receive vector design data 72 from different kinds of design computer systems, having different formats for the vector design data 72. The internal-format vector print data 82 is then divided into vector print data 84 for each individual scan strip to be used. In other words, the pattern is fractioned into a number of fraction patterns, each one of which defines the pattern to be printed within a single scan strip. Finally, the vector print data 84 for each individual scan strip is further rasterized into bitmap data 86. The rasterization is made to correspond to the individual laser beam widths and to the resolution between different power modulations during the microsweeps. Each value in the bitmap data 86 thus ideally corresponds to the requested exposure magnitude in each point at the substrate 10.

The bitmap data 86 is transferred to the control unit 50 of the printing arrangement 2. The bitmap data 86 is there used for controlling the laser modulation in accordance to the scan and microsweep positions.

As described further above, a typical prior art printing system exposes the substrate in only one scan direction and during the return of the printing head in the other direction, the actual printing is put on hold.

Figure 6:
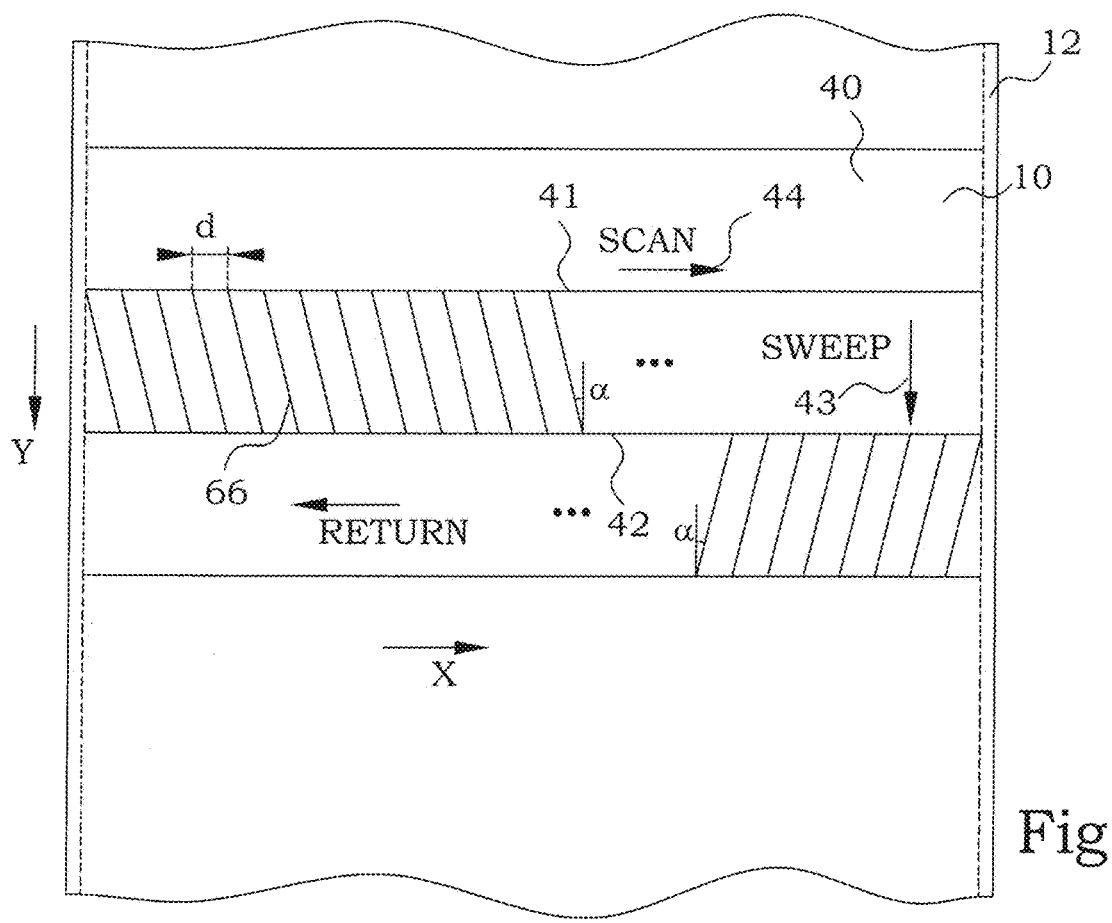
FIG. 6 schematically the origin of an azimuthal angle when bi-directional scans are used.

One possible approach to increase the efficiency and throughput is to make the exposure in both directions. However, if exposure during a return scan would be implemented directly in an existing system, the compensation for the azimuth angle will not be functional in the return scan, since the azimuth angle of the sweep will change sign when the scan direction changes direction. This is schematically illustrated in FIG. 6. Here a situation without azimuth adjustment is illustrated. In the forward scan direction, there will be an azimuth angle α, while there in the return scan direction will be an azimuth angle of the same magnitude, but in the opposite direction. The result is a fishbone-like sweep pattern, which cannot be compensated by a single azimuth angle adjustment.

One, at least theoretically possible, solution would be to use two azimuth angles, with opposite signs. The first angle is used in the forward scan direction and the second opposite angle is used in the return scan direction. However, this requires a complicated mechanical-electrical solution for turning the azimuth angle every few seconds. The demands of the accuracy of such re-positioning is extremely high, which makes such a solution difficult to accomplish in practice or at least associated with an extremely complex and expensive equipment.

An alternative, preferred solution, is to keep the azimuth angle constant, preferably close to zero and instead let the pattern data controlling the modulator signal compensate for the resulting azimuth mismatch by transforming the pattern data with a skew angle alternating sign every scan strip, i.e. every relative scan of the printing head. This enhances possibilities to increase the system overall throughput using a bi-directional exposure.

By adding an inverse skew compensation to the pattern data, alternating between a positive skew angle and a negative skew angle, between every scan strip, the exposure will be back to nominal, even when bi-directional scan exposure is applied.

The use of inverse skew compensation is, however, not limited to the forward and return scan scenario. It is also applicable in other situations. First of all, it can be noted that the inverse skew compensation can be applied in a common system of mono-directed scan exposure, as an alternative to mount the printing head adjusted for the azimuth angle.

This approach also opens up for using different scan velocities, depending on the actual pattern to be printed. In patterns, not requiring as high precision as possible, the scan velocity can be increased and thereby reduce the overall processing time. By applying the inverse skew compensation in the print data, such speed changes can be performed on an item to item basis without need of mechanical readjustment of the azimuth angle.

Furthermore, the use of different scan velocities may even be implemented within one and the same pattern. If a pattern comprises scan strips having differing demands of accuracy, different scan speeds may be assigned to the different scan strips. Since the inverse skew compensation is performed individually for each scan strip, the inverse skew compensation can be performed to the actual scan speed intended to be used for that particular scan strip.

A similar possibility to vary the speed of the sweep. In a normal case, the speed of the sweep is constant. However, for particular applications and particular patterns, a varying speed of sweep for different scan strips may be advantageous.

A skew compensation can be added to pattern data in different ways, either in the vector data domain or in the pixel data domain. In the pixel domain a skew compensation would in most cases be performed by a pixel resampling at a fixed angle, an operation, which may be time consuming and reduce the smoothness of the pattern edges.

In the vector data domain a skew compensation simply means to add a horizontal shift dx to every vector corner point where dx=y*tan α, with α being the alternating azimuth angle, and y being the y-coordinate inside the scanstrip of the corner point. The transformation itself is therefore very simple. However, a minor drawback is that it transforms every vertical straight line into an angled line, thus increasing rasterizing time.

Figure 7:
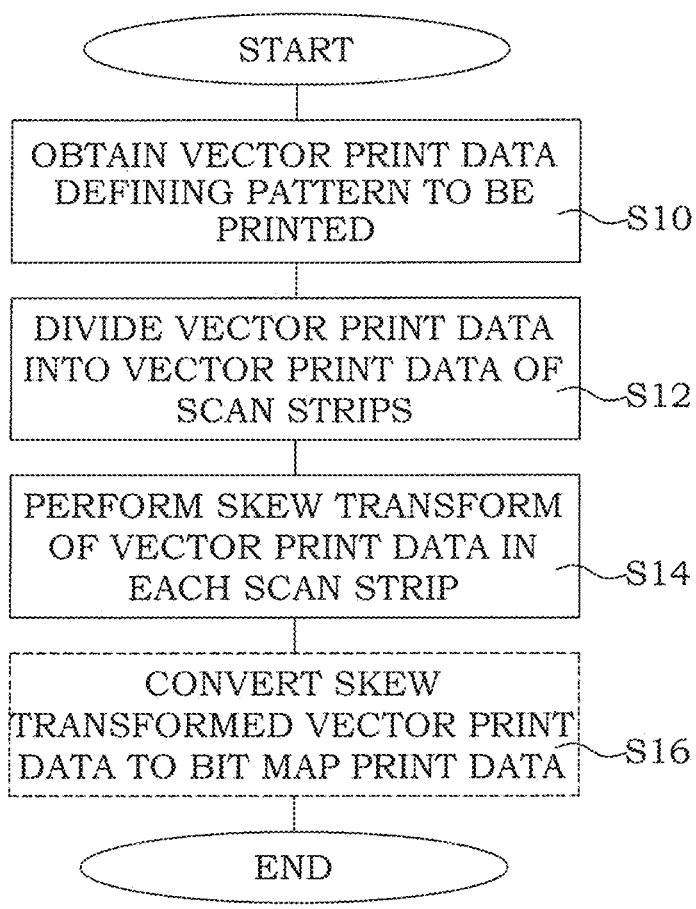
FIG. 7 illustrates a flow diagram of an embodiment of a method for processing print data defining a pattern to be printed.

FIG. 7 illustrates a flow diagram of an embodiment of a method for processing print data defining a pattern to be printed. In step S10, vector print data for the pattern to be printed is obtained. The vector print data can be received from an external source or can be produced within the printing system itself. In step S12, vector print data is divided into vector print data of scan strips. Each scan strip is associated with a scan velocity. In the case of an ordinary mono-directional scan exposure, this scan velocity is the same for all scan strips. In the case of scan exposures having different intended scan velocities, the associated scan velocity may differ between each scan strip. In other words, the scan velocity is an intended scan velocity for printing according to the obtained print data In the case of a bi-directional scan exposure, the speed of the scan is the same for each scan strip, but the direction alternates, i.e. the scan velocity changes its sign between two consecutive scan strips.

In step S14, a skew transformation of the vector print data is performed in each scan strip. The skew transformation is performed in a direction opposite to respective scan velocity and with a magnitude proportional to a magnitude of the scan velocity.

As described further above, preferably each scan strip has a first and a second linear border, both parallel to a direction of respective associated scan velocity. A sweep direction is then defined from the first linear border to the second linear border.

Thus, preferably, the sweep direction is a direction of an intended sweep perpendicular to the scan velocity during a scan.

The preferred solution for introducing a skew transformation would therefore be to add the skew compensation into the vector domain after dividing the pattern data into scan strips. In a bi-directional scan exposure, the alternating angle skew transforms are set exactly on the data set belonging to a particular scan strip scan direction.

Figure 8:
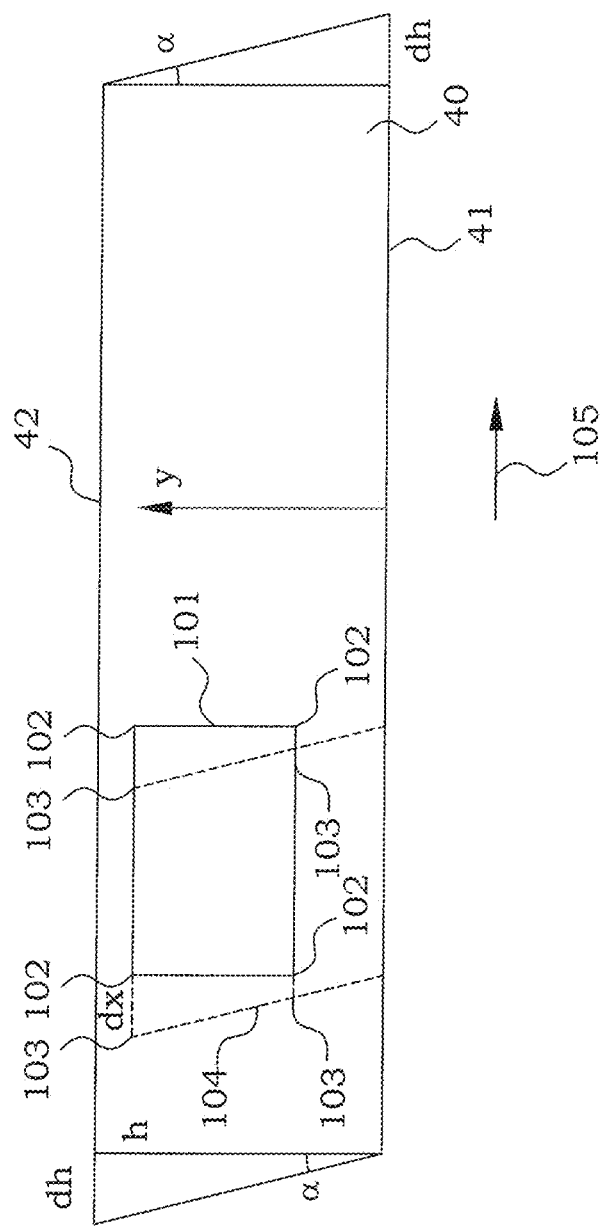
FIG. 8 illustrates a skew transform.

The principle is illustrated in FIG. 8. A scan strip 40 is shown, having a first linear border 41 and a second linear border 42. A vector object 101 is defined by coordinates of selected features thereof. In the illustrated example the vector object 101 is a rectangle, which is defined by the coordinates of its corners 102. In the skew transform, the corners of the object are shifted a respective distance dx, defined as:

$$dx = y * \tan \alpha,$$

with $\alpha$ being the alternating azimuth angle, as mentioned above. This shift takes place in the opposite direction, compared to the intended scan direction, indicated by the arrow 105. The shifted corners 103 defines a new vector object 104, in this example a parallelogram.

In other words, the skew transform in each scan strip comprises moving of coordinates of the vector print data in the direction opposite to respective scan velocity. The coordinates are moved a skew distance, which is proportional to a distance between the coordinates and the first linear border 41.

Stated differently, the ratio between the skew distance and the distance between the coordinates and the first linear border is equal to the ratio between the magnitude of the scan velocity and the speed of the sweep.

The increased rasterizing time for typical patterns with a lot of vertical lines can be handled by increasing the computer for this purpose.

When performing the skew transforms, the width of the scan strips must at the same time be extended in order not to lose the small part of data angled placed outside of the original scan strip boundary. This is indicated at the ends of the scan strip in FIG. 8. This extension is 2*dh, with dh being the full skew width at the full microsweep height, i.e. over the full distance between the first linear border 41 and the second linear border 42. dh is thus defined as:

$$dh = h * \tan \alpha$$

In a typical system, all scan strips are equally long, and the transform must therefore extended all scan strips symmetrically at both ends.

Note that in a typical case, the aspect ratio of a scan strip is much larger, i.e. the length of the scan strip is very much larger than the width of the scan strip. The illustration in FIG. 8 is made only for illustrating the principles. This means that the azimuth angle in a real case is typically much smaller, and the extension on each side of the scan strip is much smaller than the length of the scan strip.

In an embodiment preparing for a bi-directional scan printing, i.e. where the vector print data is intended for a bi-directional scan printing, consequently, the scan velocity is directed in alternating directions for consecutive scan strips.

Figure 9:
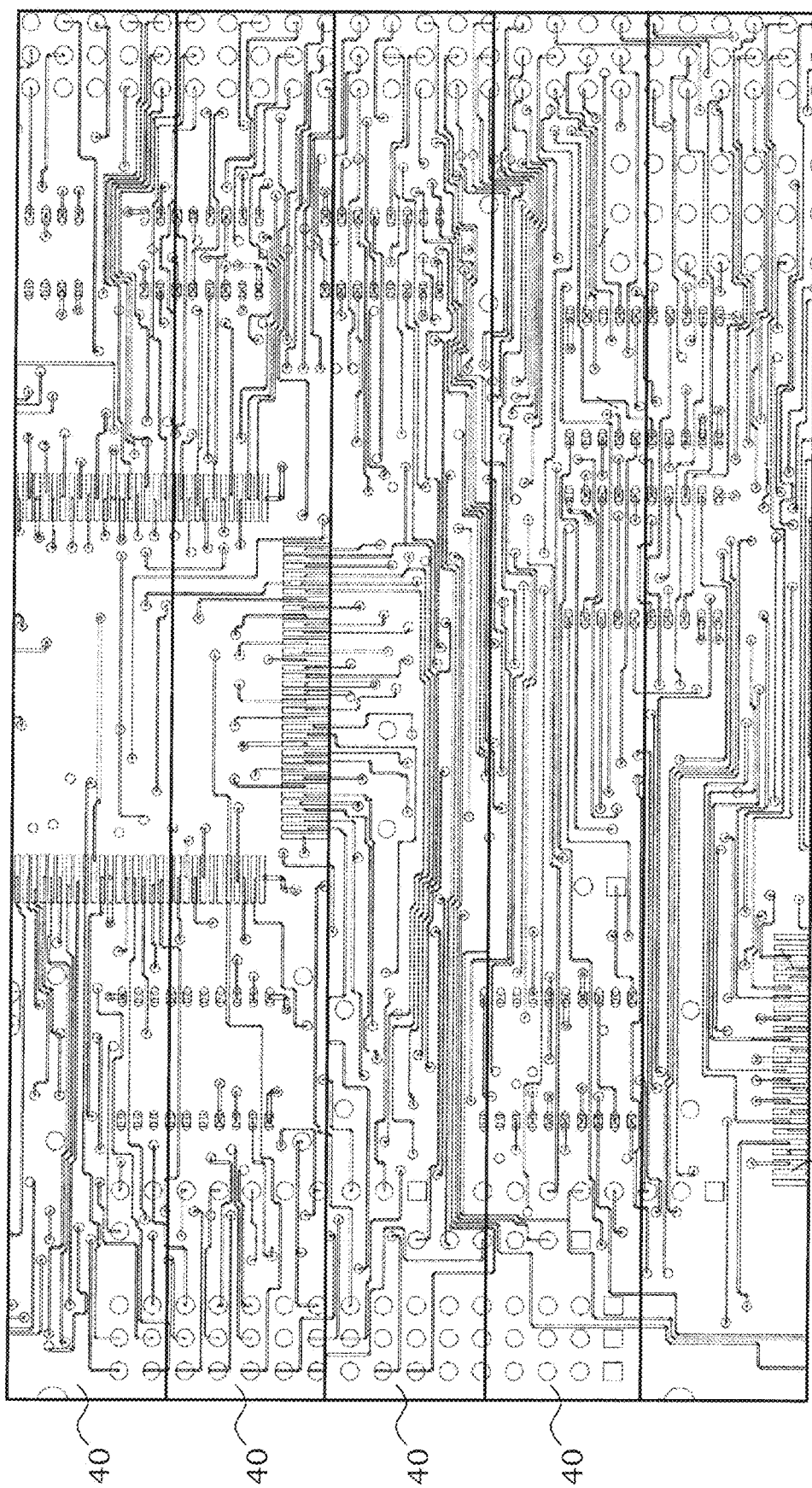
FIG. 9 illustrates a part of a pattern to be printed.

FIG. 9 illustrates a couple of scan strips 40 of a pattern to be printed. The different objects in the pattern are defined by vector print data. If this pattern is going to be printed using a bi-directional scan printing, there is a need for a skew transform.

Figure 10:
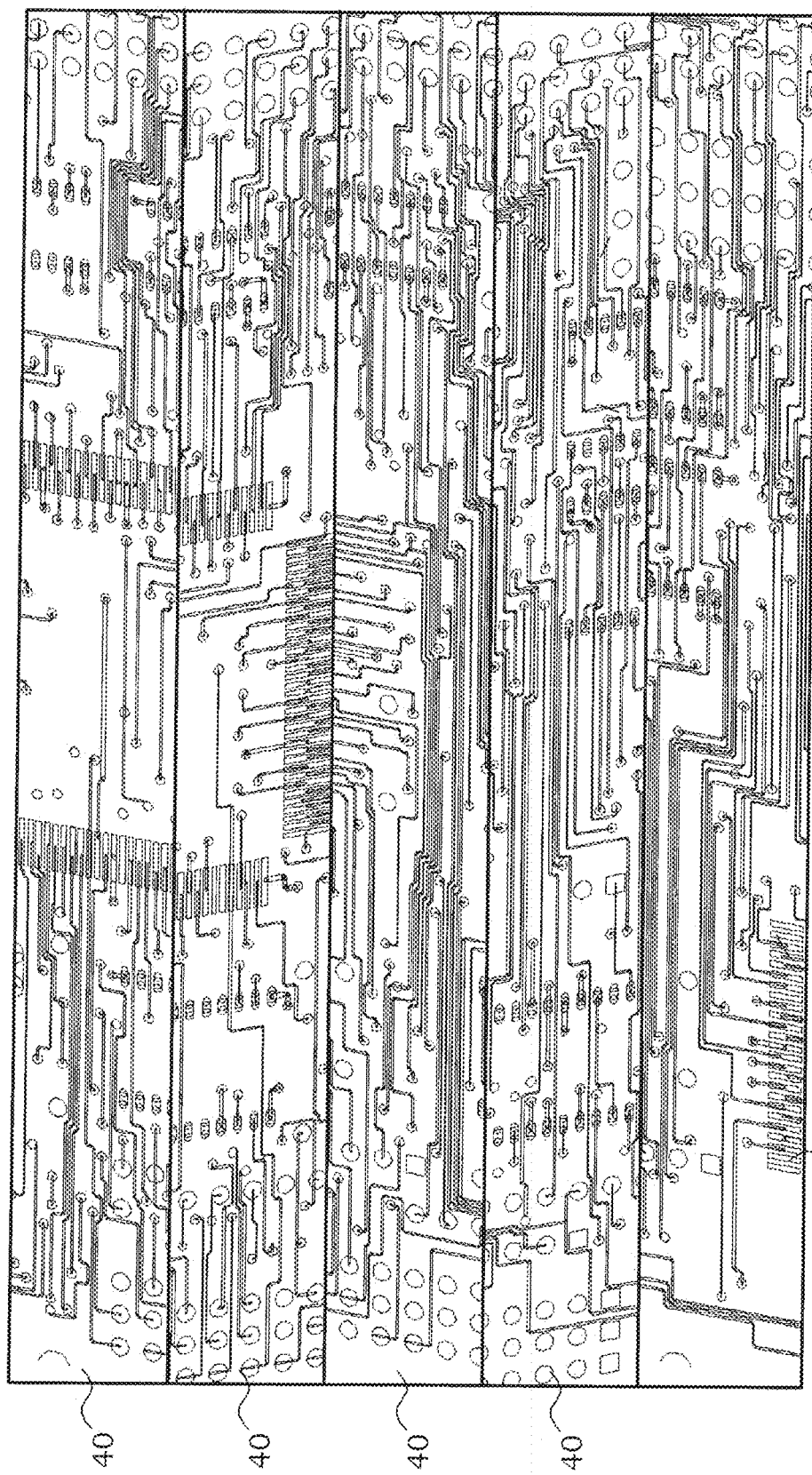
FIG. 10 illustrates a bi-directional scan skew transform of the pattern of FIG. 9.

FIG. 10 illustrates corresponding skew transformed scan strips. The objects in the pattern are here tilted with an angle corresponding to the azimuth angle. The tilting of the pattern object is of opposite direction in consecutive scan strips due to the changing scan direction. Using such skew transformed vector print data in the bi-directional scan printing will result in a printed pattern resembling the original patterns are defined in FIG. 9.

When the skew transformed vector print data has been produced, it is preferred to follow the normal procedure of continuing the print data processing. To this end, the skew transformed vector print data is preferably converted into bit map print data, as indicated by step S16 in FIG. 7. This bit map data is then typically provided to the printing arrangement for controlling the actual printing action.

Figure 11:
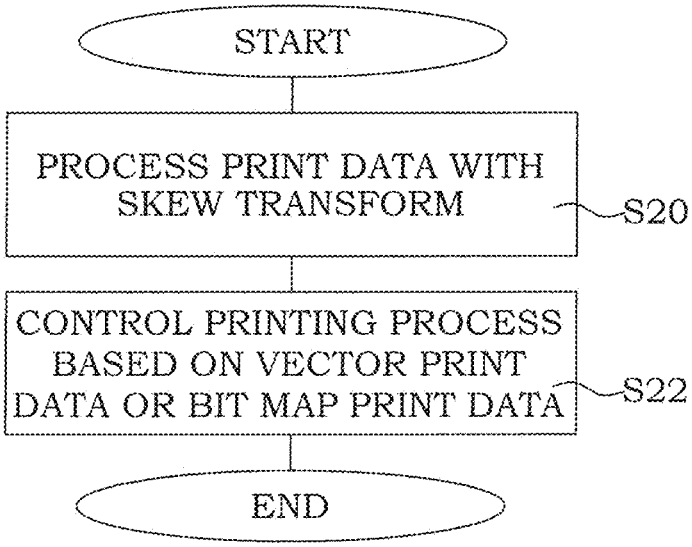
FIG. 11 illustrates a flow diagram of steps of an embodiment of a method for printing a pattern.

FIG. 11 illustrates a flow diagram of steps of an embodiment of a method for printing a pattern. In step S20, print data is processes according to any of the embodiments described above, comprising a skew transform, e.g. according to FIG. 7. In step S22, a printing process is controlled based on the vector print data or the bit map print data, produced as described above.

The controlling of the printing process may comprise controlling of a scan velocity of the printing process to be equal to the scan velocity used in the step of processing of print data.

The controlling of the printing process may also comprise controlling of a sweep speed of the printing process to be equal to the sweep speed used in the step of processing of print data.

If the printing utilizes bi-directional scan printing, the controlling of the printing process may comprise reversing of a scan velocity direction between consecutive scans.

In the control of the printing process, the relative motion of a printing head with respect to a substrate is typically controlled. This motion can be achieved by a movable printing head and a stationary substrate. Alternatively, it can be achieved by a stationary printing head and a movable substrate. In a further alternative, it can be achieved by both a movable printing head and a movable substrate.

The above described methods may be applied to a micro-lithographic printing process. The methods can be performed for a mask writing process or for a direct writing process.

Figure 12:
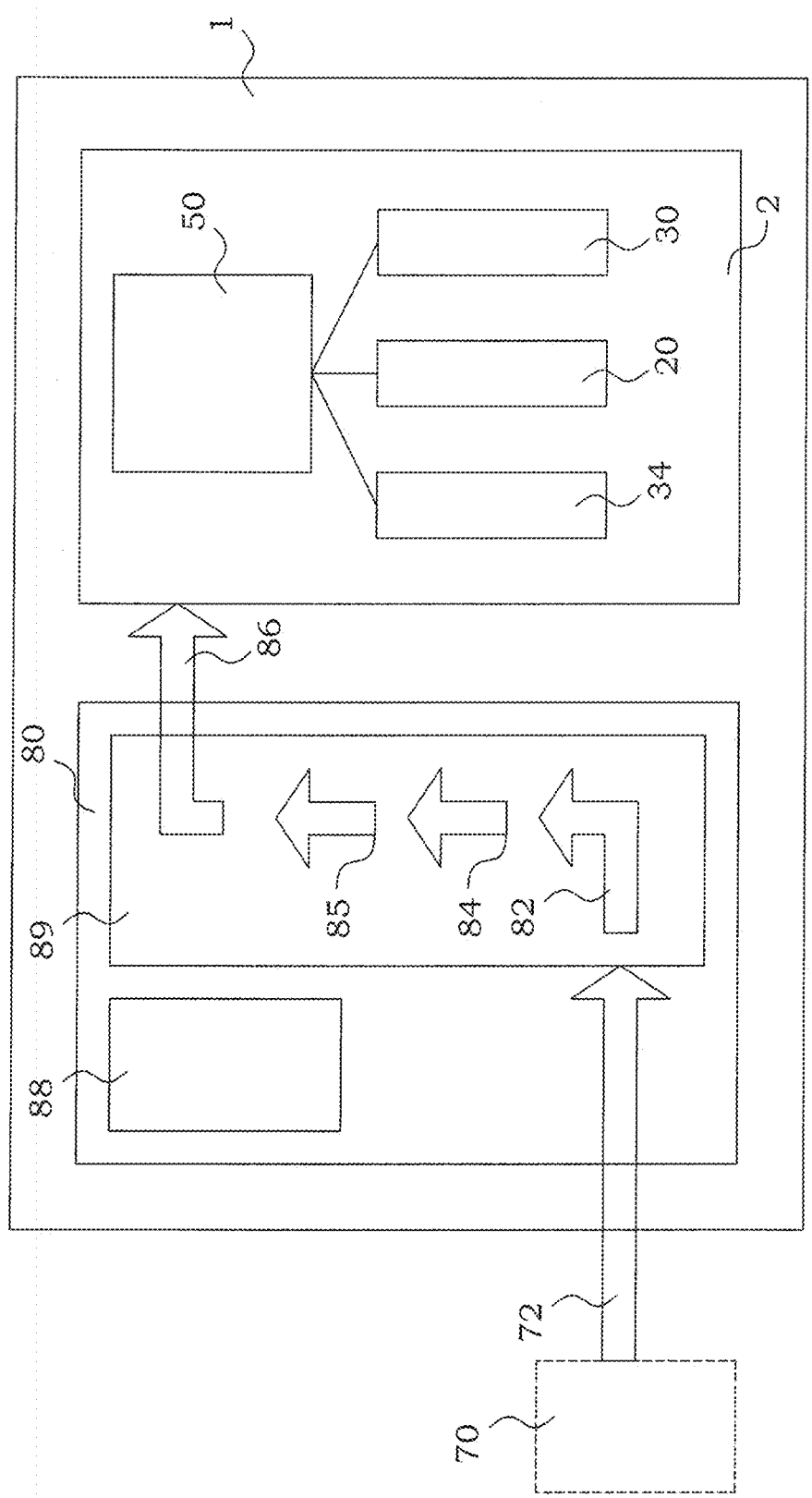
FIG. 12 illustrates schematically an embodiment of a printing device.

The skew transform process typically takes place in a device for processing print data defining a pattern to be printed. In FIG. 12, a device for processing print data 80 is illustrated as a part of a printing device 1. However, alternatively, the device for processing print data 80 may also be provided as an external device, providing processed bitmap data to the printing arrangement. The device for processing print data 80 typically comprises processing circuitry 89 and a memory 88. The memory 88 comprises instructions executable by the processing circuitry 89. Thereby the processing circuitry 89 becomes operative to obtain vector print data for the pattern to be printed, to divide the vector print data into vector print data scan strips. Each scan strip is associated with a scan velocity. The processing circuitry 89 further becomes operative to perform a skew transformation of the vector print data in each scan strip, giving transformed vector print data 85. The skew transformation is performed in a direction opposite to respective scan velocity and with a magnitude proportional to a magnitude of the scan velocity.

Preferably, the scan velocity is an intended scan velocity for printing according to the print data In one embodiment, each scan strip has a first and a second linear border, both parallel to a direction of respective associated scan velocity, wherein a sweep direction is defined from the first linear border to the second linear border.

In one embodiment, the sweep direction is a direction of an intended sweep perpendicular to the scan velocity during a scan.

In one embodiment, the skew transform in each scan strip comprises moving of coordinates of the vector print data in the direction opposite to respective the scan velocity by a skew distance that is proportional to a distance between the coordinates and the first linear border. Preferably, a ratio between the skew distance and the distance between the coordinates and the first linear border is equal to a ratio between the magnitude of the scan velocity and a speed of the sweep.

In one embodiment, the vector print data is intended for a bi-directional scan printing. The scan velocity may then be directed in alternating directions compared to a consecutive scan strip.

In one embodiment, instructions executable by the processing circuitry render the processing circuitry operative to convert the skew transformed vector print data into bit map print data.

The entire printing device 1 according to the embodiment of FIG. 12 thus comprises a device for processing of print data according to what was described here above. The printing device 1 further comprises a printing head 30, movable relative to a substrate, and a control unit 50. The control unit 50 is arranged to control an operation and relative motion of the printing head 30 based on the skew transformed vector print data.

The control unit 50 may be arranged for controlling of a relative scan velocity of the printing head 30 with respect to the substrate to be equal to the scan velocity used in the device for processing of print data 80.

In one embodiment, the control unit 50 is arranged for controlling a relative sweep speed of the printing head 30 with respect to the substrate transverse to the direction of the scan velocity to be equal to the sweep speed used in the device for processing of print data 80.

In one embodiment, the control unit 50 is arranged for reversing a scan velocity direction between consecutive scans.

In one embodiment, the control unit 50 is arranged for keeping the printing head or the substrate stationary, while moving the other during a printing process. Alternatively, both the printing head and the substrate can be controlled to be moved simultaneously.

The printing device 1 may be a micro-lithographic printing device. In some embodiments, the printing device is a mask writing device or a direct writing device.

The skew transform is, as described here above, preferably performed by processing circuitry. Consequently, such a skew transform process is typically provided as a computer program. Therefore, in one embodiment, a computer program comprising instructions, which when executed by a processing circuitry, cause the processing circuitry to obtain vector print data for a pattern to be printed, divide the vector print data into vector print data scan strips, wherein each scan strip is associated with a scan velocity, and to perform a skew transformation of the vector print data in each scan strip. The skew transformation is performed in a direction opposite to respective scan velocity and with a magnitude depending on a magnitude of the scan velocity.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The invention claimed is:

1. A method for processing print data, said print data defining a pattern to be printed, the method comprising:
   obtaining vector print data for said pattern to be printed;
   dividing said vector print data into vector print data of separate, respective scan strips, each scan strip of the scan strips being associated with a scan velocity; and
   performing a skew transformation of vector print data of each scan strip of the scan strips into skew transformed vector print data, said skew transformation being performed in a direction opposite to respective said scan velocity and with a magnitude proportional to a magnitude of said scan velocity.

2. The method according to claim 1, wherein said scan velocity is an intended scan velocity for printing according to said print data.

3. The method according to claim 1, wherein each scan strip of the scan strips has a first and a second linear border, both parallel to a direction of respective said associated scan velocity, wherein a sweep direction is defined from said first linear border to said second linear border.

4. The method according to claim 3, wherein said sweep direction is a direction of an intended sweep perpendicular to said scan velocity during a scan.

5. The method according to claim 3, wherein said skew transformation of the vector print data of each scan strip of the scan strips comprises moving of coordinates of said vector print data in said direction opposite to respective said scan velocity by a skew distance (dx) being proportional to a distance (y) between said coordinates and said first linear border.

6. The method according to claim 5, wherein a ratio between said skew distance (dx) and said distance (y) between said coordinates and said first linear border is equal to a ratio between the magnitude of said scan velocity and a speed of a sweep perpendicular to said scan velocity during a scan.

7. The method according to claim 1, wherein said vector print data being intended for a bi-directional scan printing, whereby said scan velocity is directed in alternating directions for consecutive scan strips.

8. The method according to claim 1, further comprising:
converting said skew transformed vector print data into bit map print data.

9. A method for printing a pattern, the method comprising:
processing print data according to the method of claim 1; and
controlling a printing process based on at least one of said skew transformed vector print data and bit map print data.

10. The method according to claim 9, wherein said controlling the printing process comprises reversing a scan velocity direction between consecutive scans.

11. The method according to claim 9, wherein said controlling the printing process comprises controlling a relative motion of a printing head with respect to a substrate.

12. The method according to claim 9, wherein said printing process is a micro-lithographic printing process.

13. The method according to claim 12, wherein said printing process is a mask writing process or a direct writing process.

14. A device for processing print data defining a pattern to be printed, the device comprising:
processing circuitry; and
a memory, said memory comprising instructions executable by the processing circuitry,
whereby the processing circuitry is operative to execute the instructions to:
obtain vector print data for said pattern to be printed,
divide said vector print data into vector print data of separate, respective scan strips, each scan strip of the scan strips being associated with a scan velocity, and
perform a skew transformation of said vector print data of each scan strip of the scan strips into skew transformed vector print data, said skew transformation being performed in a direction opposite to respective said scan velocity and with a magnitude proportional to a magnitude of said scan velocity.

15. The device according to claim 14, wherein said vector print data is intended for a bi-directional scan printing, whereby said scan velocity is directed in alternating directions compared to a consecutive scan strip.

16. A printing device, comprising:
the device of claim 14;
a printing head, the printing head movable relative to a substrate; and
a control unit,
said control unit being arranged to control an operation and relative motion of said printing head based on said skew transformed vector print data.

17. The printing device according to claim 16, wherein said control unit is arranged for controlling of a relative scan velocity of said printing head with respect to said substrate to be equal to said scan velocity used in said device for processing of print data.

18. The printing device according to claim 16, wherein said control unit is arranged for controlling of a relative sweep speed of said printing head with respect to said substrate transverse to said direction of said scan velocity to be equal to a sweep speed used in said device for processing of print data.

19. The printing device according to claim 16, wherein said printing device is a micro-lithographic printing device.

20. A computer program comprising instructions, which when executed by a processing circuitry, cause the processing circuitry to:
obtain vector print data for a pattern to be printed;
divide said vector print data into vector print data of scan strips, each scan strip of the scan strips being associated with a scan velocity; and
perform a skew transformation of said vector print data in each scan strip of the scan strips into skew transformed vector print data, said skew transformation being performed in a direction opposite to respective said scan velocity and with a magnitude depending on a magnitude of said scan velocity.

* * * * *